(12) United States Patent
Terada et al.

(10) Patent No.: US 7,723,682 B2
(45) Date of Patent: May 25, 2010

(54) TRANSMISSION ELECTRON MICROSCOPE PROVIDED WITH ELECTRONIC SPECTROSCOPE

(75) Inventors: Shohei Terada, Hitachinaka (JP);
Yoshifumi Taniguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 288 days.

(21) Appl. No.: 12/024,357

(22) Filed: Feb. 1, 2008

(65) Prior Publication Data
US 2008/0203296 A1 Aug. 28, 2008

(30) Foreign Application Priority Data
Feb. 28, 2007 (JP) ............................. 2007-048367

(51) Int. Cl.
G01N 23/02 (2006.01)
H01J 37/26 (2006.01)
(52) U.S. Cl. ................. 250/311; 250/305; 250/306; 250/307; 250/310; 250/397; 250/491.1
(58) Field of Classification Search ................. 250/311, 250/305, 306, 307, 310, 397, 491.1
See application file for complete search history.

(56) References Cited

U.S. PATENT DOCUMENTS

| | | | |
|---|---|---|---|
| 7,262,411 B2* | 8/2007 | Nguyen-Huu et al. | 250/310 |
| 7,459,680 B2* | 12/2008 | Kaneyama | 250/305 |
| 2004/0188608 A1 | 9/2004 | Kaneyama | |
| 2009/0242766 A1* | 10/2009 | Terada et al. | 250/311 |

FOREIGN PATENT DOCUMENTS

| | | |
|---|---|---|
| JP | 9-43173 A | 2/1997 |
| JP | 10-302700 A | 11/1998 |
| JP | 2000-323081 A | 11/2000 |
| JP | 2001-357812 A | 12/2001 |
| WO | WO 98/06125 A | 2/1998 |

OTHER PUBLICATIONS

Yoshida, K. et al: "Position Control of Electron Eneergy Loss Spectrum in Case of Accelerating-Voltage Fluctuation" Japanese Journal of Applied Physics, Japan Society of Applied Physics, Tokyo, JP, vo. 29, No. 11.
European Search Report dated Dec. 30, 2009 (3 pages).

* cited by examiner

*Primary Examiner*—Nikita Wells
(74) *Attorney, Agent, or Firm*—Crowell & Moring LLP

(57) ABSTRACT

In order to correct measurement magnification and measurement position of a spectral image with high efficiency and with high accuracy using an electronic spectroscope and a transmission electron microscope regarding the spectral image formed in two orthogonal axes which are an amount of energy loss axis and a measurement position information axis; a method for correcting magnification and position and a system for correcting magnification and position, both of which are capable of correcting measurement magnification and measurement position of a spectral image with high efficiency and with high accuracy using an electronic spectroscope and a transmission electron microscope regarding the spectral image formed in two orthogonal axes which are an amount of energy loss axis and a measurement position information axis, are provided.

12 Claims, 12 Drawing Sheets

Energy dispersion axis

Shape of slit for correcting magnification and position

Transmission electron microscope image

Spectral image

Intensity profile acquired from transmission electron microscope image (Black dotted line portion)

Intensity profile acquired from spectral image (White dotted line portion)

Shape of slit for correcting magnification and position

Transmission electron microscope image

Intensity profile acquired from transmission electron microscope image (Black dotted line portion)

Spectral image

Intensity profile acquired from spectral image (White dotted line portion)

40

40

TRANSMISSION ELECTRON MICROSCOPE PROVIDED WITH ELECTRONIC SPECTROSCOPE

BACKGROUND OF THE INVENTION

1. Field of the Invention

The present invention relates to a transmission electron microscope provided with an electronic spectroscope which spectrally decomposes an electron beam by an amount of energy which the electron beam has and, more particularly, relates to a transmission electron microscope which makes a convergent position differ in an energy dispersion direction of an electronic spectroscope and a direction perpendicular to the energy dispersion direction. Furthermore, the present invention relates to a method for correcting magnification or position that can perform correction of magnification or correction of measurement position of a spectral image acquired by the transmission electron microscope with high efficiency and high accuracy, and relates to a correction system for achieving the correction method.

2. Description of the Related Art

Processing dimensions of a silicon semiconductor, a magnetic device, and the like have been becoming minute and their high integration has been being achieved; and deterioration of device characteristics and degradation of reliability have been further becoming important problems. In recent years, a spectral analysis and a two-dimensional element distribution analysis using a (scanning) transmission electron microscope ((S) TEM) and an electron energy loss spectroscopy (EELS) have been becoming indispensable analysis means in order to analyze defects of semiconductor devices in a nanometer range and basically investigate and solve defect causes in development of new processes and in mass production process.

An electron energy loss spectrum is broadly classified into a zero loss spectrum that does not lose energy when passing through a sample, a plasmon loss spectrum acquired by exciting a valence band electron and losing energy, and a core electron excitation loss spectrum acquired by exciting a core electron and losing energy. In the core electron excitation loss (core loss) spectrum, a fine structure is observed in the vicinity of the absorption edge. This structure is referred to as an energy loss near-edge structure (ELNES), and has information in which an electron state and a chemical-bonding state of a sample are reflected. Furthermore, an energy loss value (absorption edge position) is specific to an element; and therefore, qualitative analysis can be made. In addition, information related to peripheral coordination of an element of interest can be acquired from a shift of an energy loss value which is referred to as a chemical shift; and therefore, simple state analysis can also be made.

Conventionally, in the case where an electron energy loss spectrum at a different point on a sample is acquired, both a scanning transmission electron microscope in which a sample is scanned with a narrowly concentrated electron beam using a scanning coil and an electronic spectroscope which can spectrally decompose by an amount of energy in which the electron beam has are combined; and accordingly, the electron beam passed through the sample is spectrally decomposed and the electron energy loss spectrum is continuously acquired.

However, in the case of such a technique, the aberration and the position of origin of the electron energy loss spectrum are changed by a drift in accelerating voltage of the electron beam and a change in magnetic field and electric field due to a disturbance change in device periphery; and therefore, it is difficult to compare shapes of the energy loss near-edge structure or minimal chemical shifts, in the electron energy loss spectra for measurement positions.

In a usual transmission electron microscope, focal point positions in an x axis and a y axis are set on the same surface and a transmission electron microscope image is acquired; whereas, Japanese Patent Application Laid-Open (JP-A) No. H10-302700 (patent document 1) discloses that a focal point position of the x axis is set to a spectral surface and the other focal point position of the y axis is set to an image surface by making the focal point positions different in the x axis and the y axis in order to solve the aforementioned problem.

As a result, the electron energy loss spectrum in the y axis direction of a sample can be separated and observed. That is, as shown in FIG. 3B, an image acquired by an image detector can be observed such that the x axis is an amount of energy loss and the y axis is a spectral image having position information of the sample. The spectral image is observed in a belt-like shape in response to each laminated film observed in the transmission electron microscope image shown in FIG. 3A. Consequently, there can be observed the electron energy loss spectra at different positions of the sample at the same time, and it is possible to compare in detail energy loss near-edge structures or minimal chemical shifts, in the electron energy loss spectra for the different positions.

The spectral image having an amount of energy loss in the x axis and sample position information in the y axis is a two-dimensional image which is acquired by the image detector by changing lens action of the electronic spectroscope or the like, and by making the focal point positions different in the x axis and the y axis. The width in the y axis direction of the spectral image can be freely adjusted by changing the focal point positions in the x axis and the y axis; however, an observation magnification in the y axis direction in the spectral image needs to be calculated because the observation magnification between the transmission electron microscope image and the spectral image is different.

It is possible to calculate the observation magnification of the spectral image from both a film thickness measured by the transmission electron microscope image and a belt-like width of the spectral image; however, in the case of a sample where a chemical shift is observed at a laminated film interface and the like, it is difficult to calculate a correct observation magnification of the spectral image because the laminated film interface blurs in the spectral image.

Furthermore, it is not possible to simultaneously observe the transmission electron microscope image and the spectral image acquired by matching the focal point positions in the x axis and the y axis. That is, in the spectral image, it is difficult to correctly associate a position in the y axis direction where the electron energy loss spectrum is acquired with one in the transmission electron microscope image.

SUMMARY OF THE INVENTION

Consequently, an object of the present invention is to provide a method for correcting magnification and position and a system for correcting magnification and position, both of which can perform correction of magnification and measurement position, which correction is a problem which a spectral image acquired by combining the above described conventional transmission electron microscope and electronic spectroscope has, with high efficiency and high accuracy.

The present invention has been made to solve the aforementioned problem, and an object of the present invention is to provide a method for correcting magnification and position and a system for correcting magnification and position, both of which are for correcting magnification of a spectral image or measurement position on a sample with high efficiency and with high accuracy regarding the spectral image formed in two orthogonal axes which are an amount of energy loss axis and a position information axis.

Specifically, there is provided a method for correcting magnification of a spectral image formed in two orthogonal axes which are an energy dispersion axis and a position information axis of an electronic spectroscope, the spectral image being acquired by a transmission electron microscope provided with the electronic spectroscope. The method for correcting magnification of the spectral image includes the step of correcting the magnification of the spectral image by both an image pattern in a direction parallel to energy dispersion of the electronic spectroscope of a transmission electron microscope image acquired by the transmission electron microscope and an image pattern in a direction parallel to energy dispersion of the electronic spectroscope of the spectral image.

Particularly, according to the present invention, there is provided a method for correcting magnification of a spectral image, which includes the steps of: imaging a reference sample with a transmission electron microscope; calculating an image resolution of an electron microscope image of the reference sample; storing the image resolution in a storage device; inserting a slit having a plurality of apertures on an electron beam orbit of the transmission electron microscope; imaging the reference sample with the transmission electron microscope via the slit; calculating the number of pixels in a pattern of the slit; calculating the size of the pattern on the reference sample from the number of pixels in the slit pattern; acquiring a spectral image by operating an electronic spectroscope; calculating an image resolution of the spectral image from a distance between image patterns of the spectral image; and storing the image resolution of the spectral image in the storage device.

Furthermore, there is provided a method for correcting measurement position of a spectral image formed in two orthogonal axes which are an energy dispersion axis and a position information axis of an electronic spectroscope, the spectral image being acquired by a transmission electron microscope provided with the electronic spectroscope. The method for correcting measurement position of the spectral image includes the step of: correcting the measurement position of the spectral image by both an image pattern in a direction parallel to energy dispersion of the electronic spectroscope of a transmission electron microscope image acquired by the transmission electron microscope and an image pattern in a direction parallel to energy dispersion of the electronic spectroscope of the spectral image.

Particularly, according to the present invention, there is provided a method for correcting measurement position of a spectral image, which includes the steps of: taking a first electron microscope image of a sample with a transmission electron microscope via a slit for correcting magnification and position; acquiring a spectral image of the sample without changing a position on the sample; taking a second electron microscope image of the sample with the transmission electron microscope again without changing the position on the sample; comparing the first and the second electron microscope images; and storing in a control device by judging that the spectral image has been measured at a correct measurement position when the first and the second electron microscope images are matched.

Furthermore, according to the present invention, there is provided a transmission electron microscope in which the electron microscope image and the spectral image are combined in response to a pattern of a slit for correcting magnification and position when the first and the second electron microscope images are matched; and displays the electron microscope image and the spectral image that are a result thereof at the same time. Then, the result is stored in a control device.

Still furthermore, according to other aspect of the present invention, there is provided a transmission electron microscope which includes: an electron gun; a convergent lens group which converges an electron beam emitted from the electron gun; a lens group which focuses the electron beam transmitted through the sample; an image detector which detects a focused image; a visual field limit slit provided for selecting a visual field; and an electronic spectroscope which spectrally decomposes the electron beam by an amount of energy which the electron beam has. The transmission electron microscope has a system for correcting magnification and measurement position, which is for correcting magnification and measurement position of a spectral image acquired by making convergent position different in an energy dispersion direction and a direction perpendicular to the energy dispersion direction of the electronic spectroscope.

In the aforementioned transmission electron microscope, there may be provided a slit for correcting magnification and position which is capable of blocking the electron beam so as to display an image pattern on the image detector in a direction parallel to the energy dispersion direction.

Further, according to other aspect of the present invention, there is provided an electron microscope which includes an image display device in which a transmission electron microscope image and a spectral image are displayed, and measurement position and range of the spectral image are recognizably displayed in the transmission electron microscope image.

As described above, a feature of the present invention is a transmission electron microscope which is provided with an electronic spectroscope, and is capable of acquiring a spectral image formed in two orthogonal axes of an energy dispersion axis and a position information axis. The transmission electron microscope has a correction system which is for correcting the acquired spectral image; and the correction system uses a transmission electron microscope image and the spectral image, and corrects the spectral image by each image pattern in a direction parallel to an energy dispersion axis of each image. According to the electron microscope of the above present invention, it is possible to correct magnification of the spectral image or correct measurement position of a sample with good efficiency.

According to the method and system for correcting magnification and position of the spectral image of the present invention, it is possible to correct magnification and measurement position of a spectral image which has different focal point positions in an x axis and a y axis with high efficiency and with high accuracy. Furthermore, according to the present invention, it is possible to provide an efficiently correctable transmission electron microscope provided with an electronic spectroscope.

DESCRIPTION OF THE PREFERRED EMBODIMENTS

Figure 1:
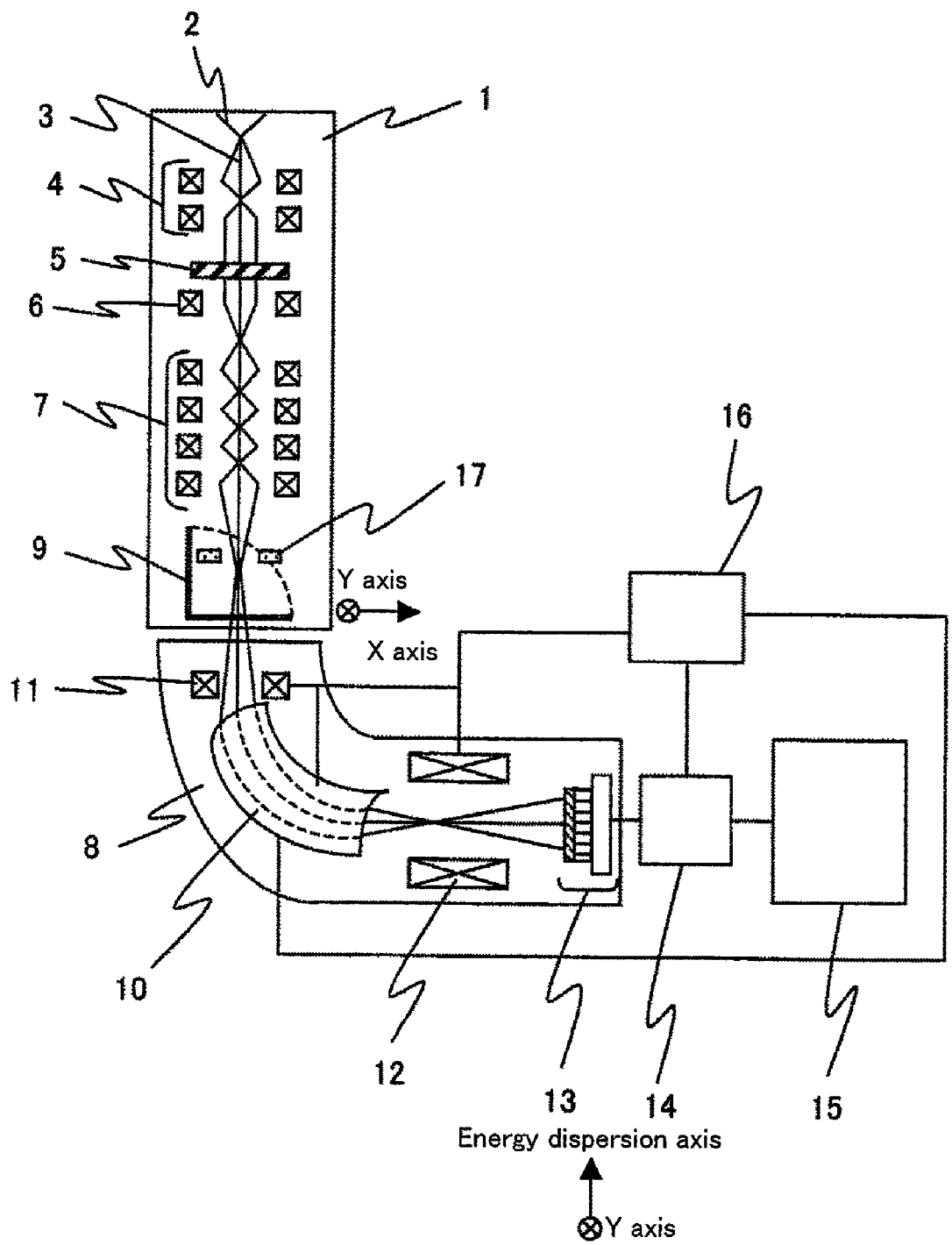
FIG. 1 is a schematic configuration view showing one example of a transmission electron microscope with an electronic spectroscope.

Preferred embodiments according to the present invention will be described in detail below with reference to drawings. In addition, the same reference numerals are given in principle to identical members in all the drawings which are for explaining the preferred embodiments, and their repetitive descriptions will be omitted.

FIG. 1 is a schematic configuration view showing one example of a transmission electron microscope with an electronic spectroscope that is one preferred embodiment according to the present invention.

The transmission electron microscope with an electronic spectroscope of the present preferred embodiment is composed of a transmission electron microscope 1, an electronic spectroscope 8, an image display device 14, a central control device 16, a system for correcting magnification and position 15, and the like. The transmission electron microscope 1 includes an electron source 2 which emits an electron beam 3, a convergent lens 4, an objective lens 6, a focusing lens system 7, a fluorescent plate 9, and the like; and a sample 5 is arranged between the convergent lens 4 and the objective lens 6. The electronic spectroscope 8 includes a magnetic field sector 10, multipole electron lenses 11 and 12, an image detector 13, and the like.

In addition, a configuration of the transmission electron microscope 1 and a configuration of the electronic spectroscope 8 are not limited to this; for example, the electronic spectroscope 8 may be arranged in the transmission electron microscope 1.

In the transmission electron microscope with the electronic spectroscope, the electron beam 3 emitted from the electron source 2 passes through the convergent lens 4 and is irradiated with to the sample 5. The electron beam 3 transmitted through the sample 5 passes through the objective lens 6 and a plurality of focusing lens systems 7, and directly enters into the electronic spectroscope 8 when the fluorescent plate 9 is opened. The entered electron beam 3 passes through the multipole electron lenses 11 and 12 which are used for focusing, enlarging, contracting, and reducing aberration of an electron energy loss spectrum and a transmission electron microscope image in the electronic spectroscope 8; and passes through the magnetic field sector 10 which can spectrally decompose by an amount of energy which the electron beam 3 has. After that, the electron beam 3 is photographed by the image detector 13 as the transmission electron microscope image, a two-dimensional element distribution image, the electron energy loss spectrum, and the like; and then, displayed on the image display device 14. Furthermore, the magnetic field sector 10 and the multipole electron lenses 11 and 12 are controlled by the central control device 16. In addition, the central control device 16 can control switching of acquiring modes of the transmission electron microscope image, the two-dimensional element distribution image, the electron energy loss spectrum, and the like. Further, the central control device 16 can control change of focal point positions in a x axis and a y axis, that is, switching of the acquiring modes of the transmission electron microscope image and the spectral image.

In the case of acquiring the spectral image, in order to limit a place where a spectrum is desired to be acquired, there is inserted a visual field limit slit 17 which is short in an x axis direction, that is, an energy dispersion direction; and is long in a y axis direction, that is, a sample measurement position direction.

Before or after a desired spectral image is acquired from the sample 5, the system for correcting magnification and position calculates an image resolution in the spectral image from a pixel size, that is, from the distance per one pixel (image resolution) of the acquired image to be calculated from the transmission electron microscope image, and store the same.

Figure 2:
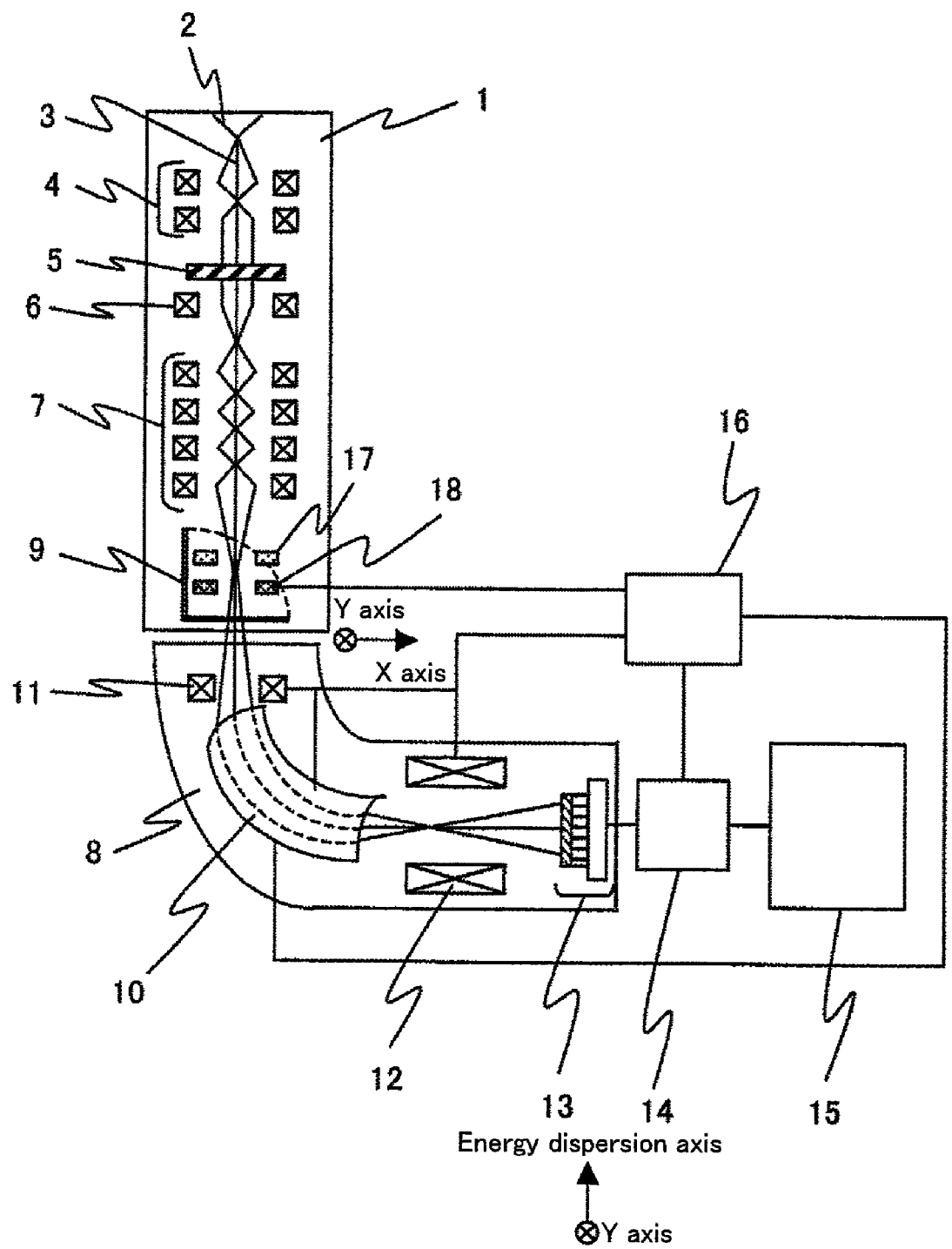
FIG. 2 is a schematic configuration view showing one example of a transmission electron microscope with an electronic spectroscope.
Figure 3A:
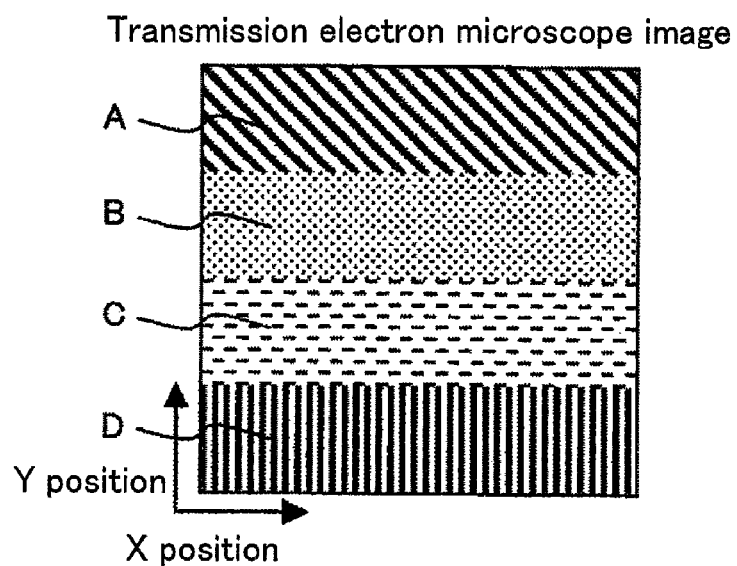
FIGS. 3A and 3B are a transmission electron microscope image and a spectral image acquired by a conventional art.
Figure 3B:
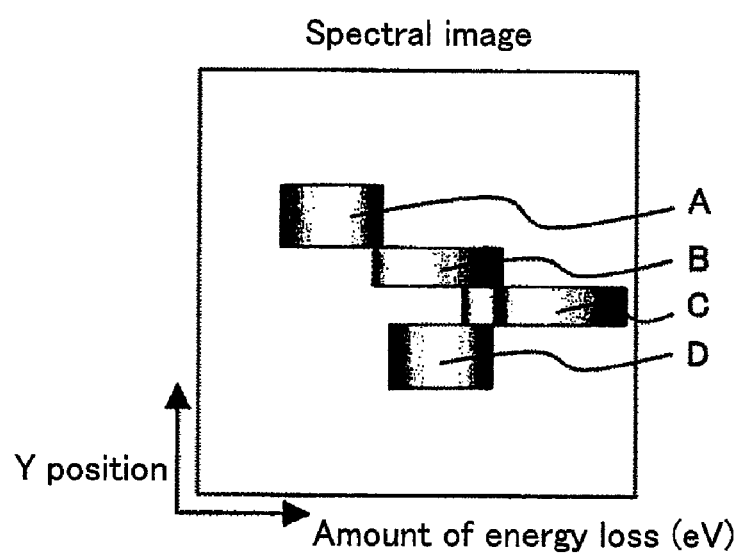

FIG. 2 is an example of an electron microscope in which a slit for correcting magnification and position 18 is used. In the case where the image resolution of the spectral image is calculated by a system for correcting magnification and position 15, the slit for correcting magnification and position 18 is inserted in a path of an electron beam 3 as shown in FIG. 2. FIGS. 4A to 4E and FIGS. 5A to 5E are diagrams showing examples of the slits for correcting magnification and position 18. The electron beam 3 is blocked by an electron beam blocking portion 19 provided in the slit for correcting magnification and position 18 to make the electron beam 3 pass through an electron beam passing portion 20; and accordingly, an image pattern 40 for correcting magnification and position can be acquired. In the case where due to other slit or the like, the image pattern 40 which is for calculating the image resolution is present in the acquired image being displayed on an image display device 14, the slit 18 is not required to be inserted.

Figure 4A:
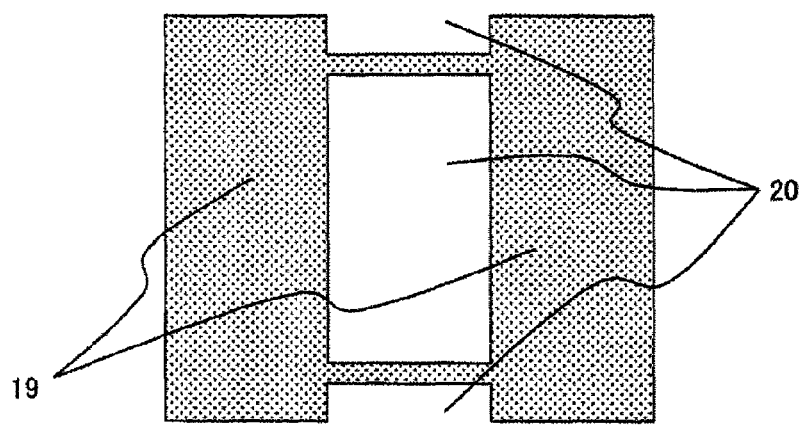
FIGS. 4A to 4E are schematic configuration views showing one example of a slit for correcting magnification and position.
Figure 5A:
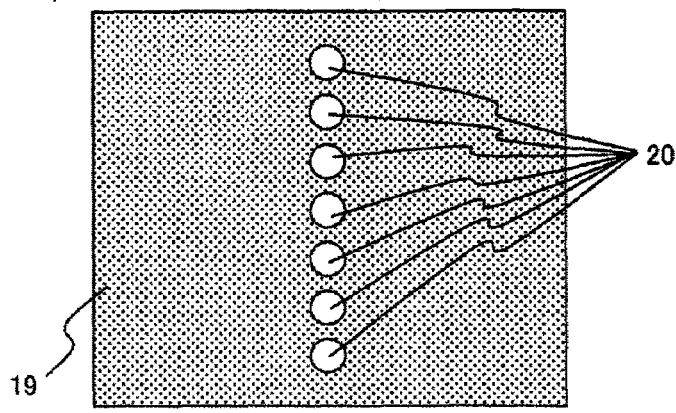
FIGS. 5A to 5E are a schematic configuration views showing one example of a slit for correcting magnification and position.
Figure 5B:
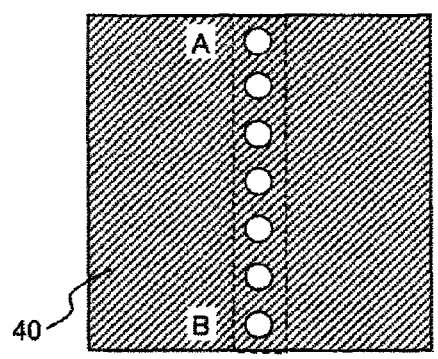

The position correction slit 18 may be one provided that the image pattern which is for correcting by the electron beam passing portion 20 that is an aperture can be acquired; the shape of the slit may be rectangular as shown in FIG. 4A or circular as shown in FIG. 5B. In FIGS. 4A and 5A, a plurality of electron beam passing portions 20 are arranged (three in FIG. 4A, and seven in FIG. 5A). When the number of the electron beam passing portion 20 is plural number (at least two), it is possible to correct by the electron beam blocking portion 19. It is preferable that the number is not less than three because adopting portions can be appropriately changed according to the sample or the like.

A plurality of electron beam passing portions 20 is disposed in a direction (y axis direction) parallel to the energy dispersion direction of a transmission electron microscope image and the spectral image. The electron beam passing portion 20 may be arranged so as to be recorded. Furthermore, it is preferable to provide a system which changes a shape, size, or the like of the electron beam passing portion 20.

Figure 4B:
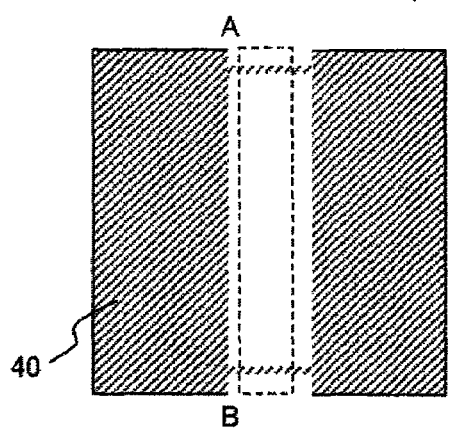
Figure 4C:
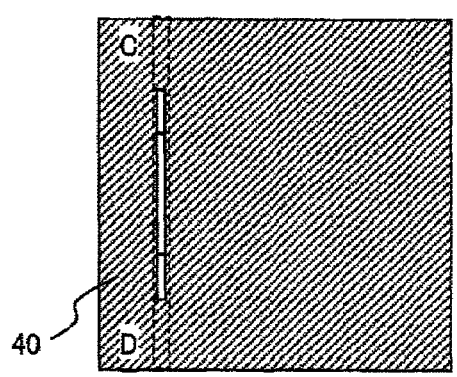
Figure 4D:
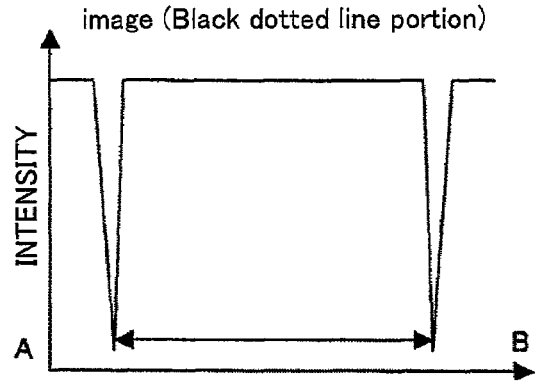
Figure 4E:
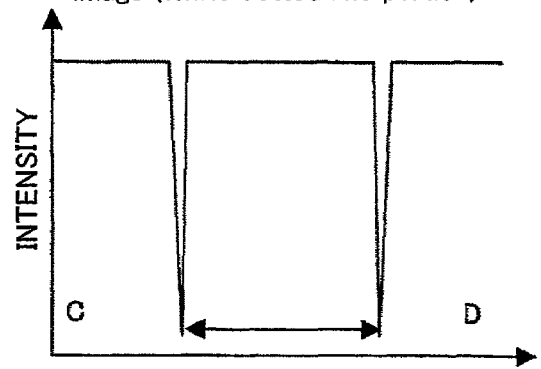
Figure 5D:
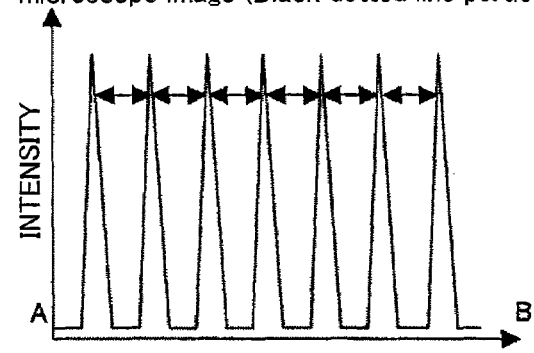
Figure 5C:
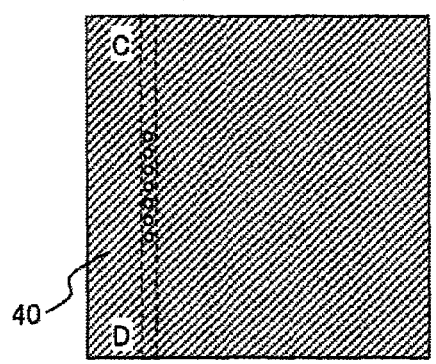
Figure 5E:
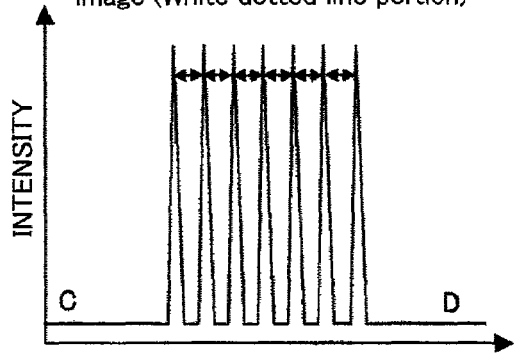

In the case where the slit for correcting magnification and position 18 shown in FIG. 4A is used, the image pattern 40 as shown in FIGS. 4B and 4C are acquired as the transmission electron microscope image and the spectral image. FIGS. 4D and 4E show intensity profiles acquired from a dotted line portion shown in FIGS. 4B and 4C. It shows that a place where the electron beam is passed is high in intensity, and a place where the electron beam is blocked is low in intensity. Furthermore, in the case where the slit for correcting magnification and position 18 shown in FIG. 5A is used, the image pattern 40 as shown in FIGS. 5B and 5C are acquired as the transmission electron microscope image and the spectral image. Intensity profiles as shown in FIGS. 5D and 5E can be acquired as in FIGS. 4D and 4E. In addition, as for the slit for correcting magnification and position 18, the same slit is not required to be always used; but, the slit may be changed depending on correction purpose and observation purpose.

Figure 6:
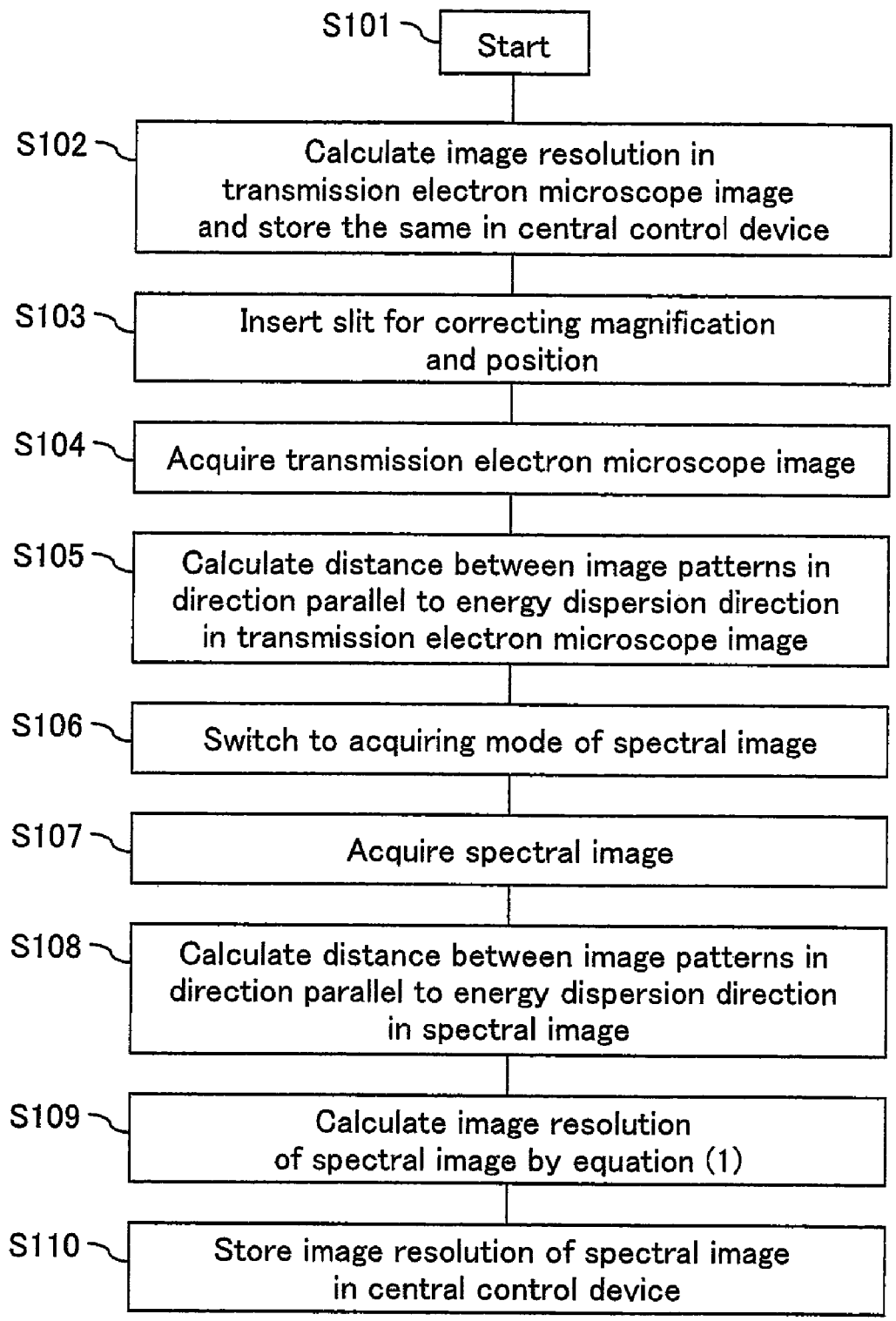
FIG. 6 is a flow chart showing a procedure for correcting magnification of a spectral image in a transmission electron microscope with an electronic spectroscope.

FIG. 6 is a flow chart showing a procedure for correcting observation magnification of a spectral image by use of the system for correcting magnification and position 15. Correction is made using a reference sample on which distance is preliminarily known, such as crystal whose crystal lattice is clear, a device whose structure is known, or the like.

First, in a transmission electron microscope image in which focal point positions of an x axis and a y axis are matched, an image of the reference sample on which distance is preliminarily known, that is, a crystal lattice image or a transmission electron microscope image of the device sample are taken by the image detector 13. The distance per one pixel (image resolution) on an acquired image is calculated from the transmission electron microscope image of the reference sample on which distance is preliminarily known, and is stored in the central control device 16 (S101 to S102). This step may be omitted if the image resolution corresponding to a magnification of the transmission electron microscope has been already stored in the central control device 16.

Next, the slit for correcting magnification and position 18 is inserted and the transmission electron microscope image is photographed; after that, the distance between image patterns 40 in a direction parallel to energy dispersion is calculated as the number of pixels on the acquired image from the transmission electron microscope image in which the electron beam 3 is blocked by the slit for correcting magnification and position 18 and photographed as the image patterns 40 (S103 to S105).

Figure 12A:
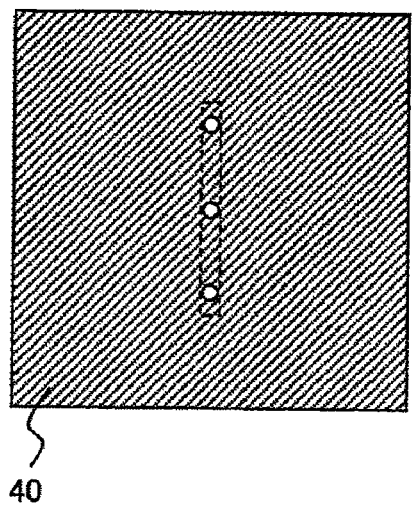
FIG. 12A is a transmission electron microscope image and an intensity profile thereof and FIG. 12B is a spectral image and an intensity profile thereof, both images and profiles being acquired by inserting a slit for correcting magnification and position in a transmission electron microscope with an electronic spectroscope.
Figure 12A:
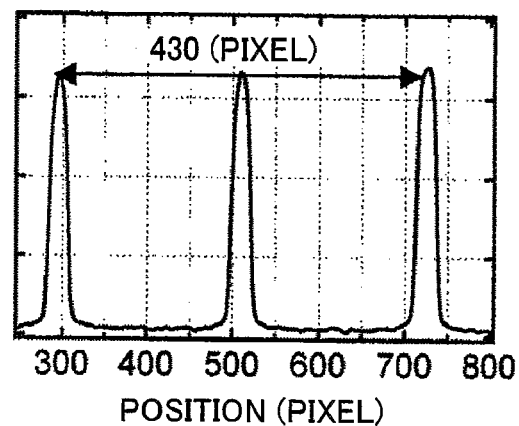
Figure 12B:
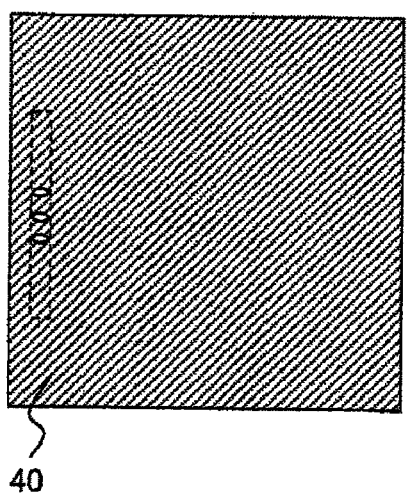
Figure 12B:
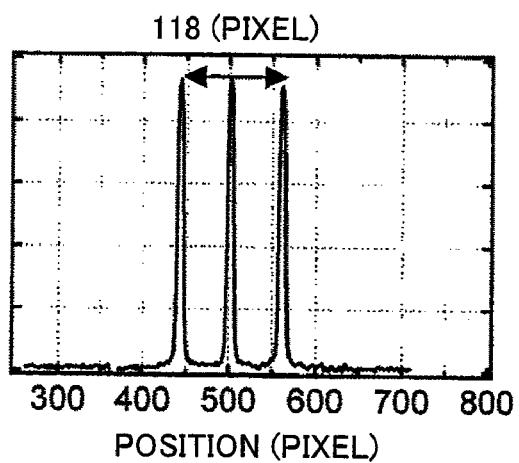

As shown in FIG. 4A, in the case where the electron beam passing portion 20 is large, it is easy to measure the distance between a plurality of the electron beam blocking portions 19 and obtain the number of pixels. On the other hand, in the case where the electron beam passing portion 20 is small as shown in FIG. 5, the distance between peaks of the profile patterns acquired from their respective electron beam passing portions 20 and the number of pixels are obtained (see FIGS. 12A and 12B).

The spectral image is photographed after switching from an acquiring mode of the transmission electron microscope image to an acquiring mode of the spectral image (S106 and S107); and the distance between image patterns 40 in a direction parallel to energy dispersion is calculated as the number of pixels on the image from the spectral image in which the electron beam 3 is blocked by the slit for correcting magnification and position 18 and photographed as the image patterns 40 (S108).

When the image resolution obtained by the transmission electron microscope image is set to $R_{TEM}$, the image resolution in the spectral image is set to $R_{spe}$, the distance between the image patterns 40 in the transmission electron microscope image is set to $d_{TEM}$, and the distance between the image patterns 40 is set to $d_{spe}$, the image resolution in the spectral image is calculated by Equation (1) and is stored in the central control device 16 (S109 to S110).

[Equation (1)]

$$R_{spe} = R_{TEM} * \frac{d_{TEM}}{d_{spe}} \quad \text{(Equation (1))}$$

In addition, this magnification correction is not required to be performed at a place where the spectral image is desired to be acquired; and is not required to be performed for each measurement and for each sample.

Next, FIG. 12 shows a specific example of the aforementioned magnification correction of the spectral image. The present specific example was executed using the transmission electron microscope 1 with the electronic spectroscope 8, and measurement magnification of the spectral image was corrected using the system for correcting magnification and position 15 of the present invention.

An accelerating voltage of the transmission electron microscope 1 at the time when acquiring the spectral image was set to 197 kV, an acceptance angle of the electron beam 3 was set to 4.4 mrad, and energy dispersion was set to 0.02 eV/pixel. The image detector 13 which was used for acquiring the transmission electron microscope image and the spectral image was a two-dimensional detector having 1024 pixels× 1024 pixels. Furthermore, an observation magnification on the display in the transmission electron microscope was 10,000 times.

In the case of the observation magnification of the above described transmission electron microscope, the image resolution of the transmission electron microscope image acquired from the image detector 13 was 0.137 nm/pixel.

Then, after the slit for correcting magnification and position 18 was inserted in the path of the electron beam 3; a transmission electron microscope image 27 was photographed; and subsequently, the spectral image was photographed. Intensity profiles of the image patterns 40 recorded by inserting the slit for correcting magnification and position 18 were extracted from both images. As a result, the distances between both ends of the image patterns 40 formed by the electron beam passing portion 20 were 430 pixels in the transmission electron microscope image and 118 pixels in the spectral image. As a result of calculation using Equation (1), the image resolution of the spectral image was calculated as 0.503 nm/pixel.

As described above, the invention made by the present inventor is specifically described according to the preferred embodiments; however, the present invention is not limited to the aforementioned preferred embodiments. It is to be understood that various modifications may be made without departing from the spirit or scope of the present invention.

Figure 7:
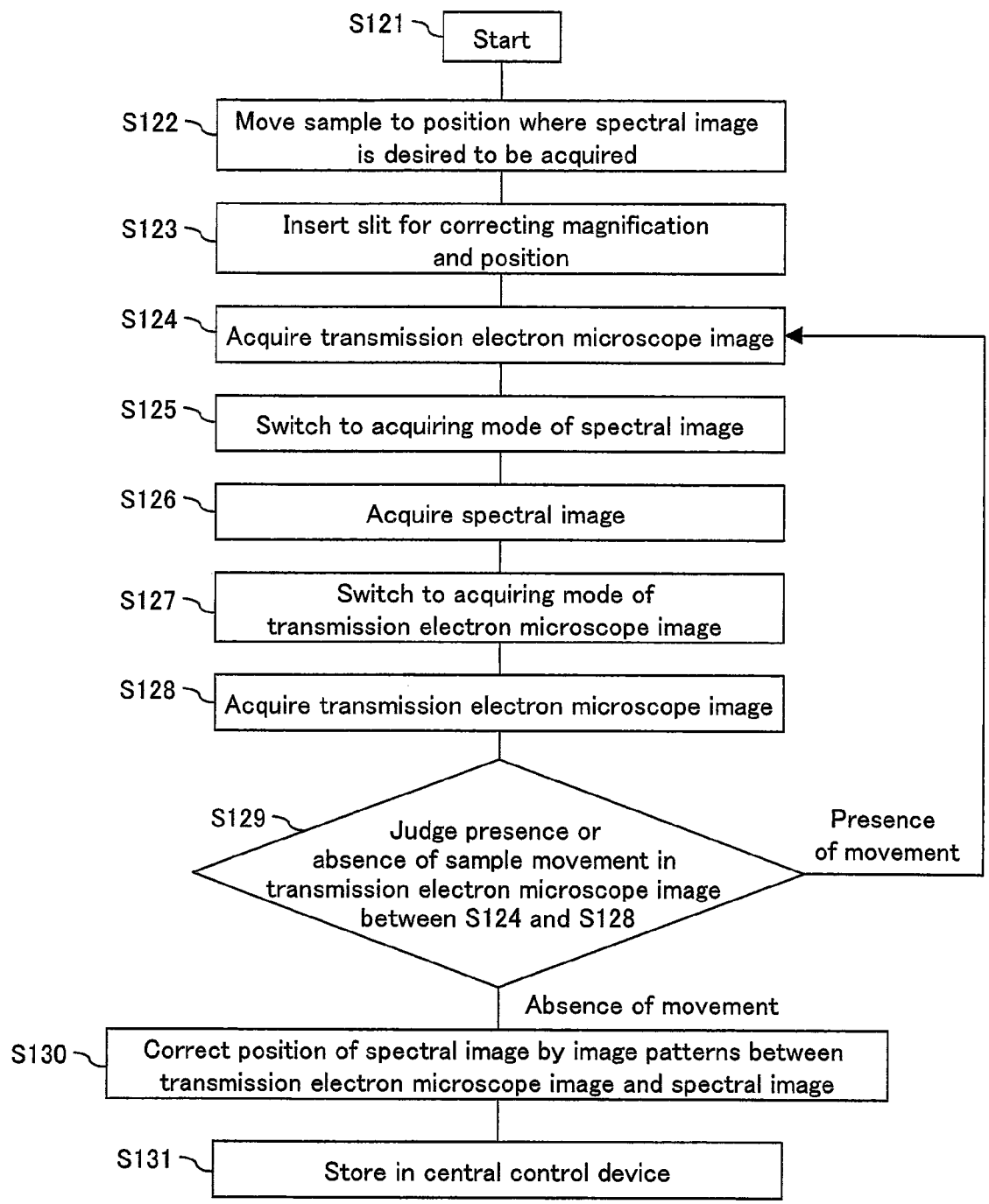
FIG. 7 is a flow chart showing a procedure for correcting measurement position of a spectral image in a transmission electron microscope with an electronic spectroscope.

FIG. 7 is a flow chart showing a procedure for correcting measurement position of a spectral image by use of the system for correcting magnification and position. The position correction is appropriately performed using a measurement sample for each measurement or at a time when the sample is changed.

According to the present embodiments, it is possible to measure an image of an electron microscope image and a spectral image at the same sample position, make position information of their respective results match, and display as a measurement result of the sample.

After the sample is moved to a position where the spectral image is desired to be acquired, the slit for correcting magnification and position 18 is inserted, and the transmission electron microscope image in which focal point positions in an x axis and a y axis are matched is acquired (S121 to S124).

Next, switching from an acquiring mode of the transmission electron microscope image to an acquiring mode of the spectral image is made; an energy value of the spectral image which is desired to be acquired is input; and then, a spectral image in which the focal point positions in the x axis and the y axis are different is simultaneously photographed with the slit for correcting magnification and position 18 (S125 to S126).

Once again, switching from the acquiring mode of the spectral image to the acquiring mode of the transmission electron microscope image is made; a transmission electron microscope image is acquired; and it is determined whether or not the measurement position is moved between the transmission electron microscope images acquired before and after acquisition of the spectral image (S127 to S129).

If, in the case where the measurement position is moved between the transmission electron microscope images, there generates sample movement (drift) in acquiring the spectral image; and therefore, the acquisition of transmission electron microscope image and spectral image is reattempted again.

In the transmission electron microscope image acquired before and after acquisition of the spectral image, if movement of the measurement position is not observed, correction is made so as to match the acquisition position of the spectral image to the measurement position of the transmission electron microscope image by the image patterns 40 between the transmission electron microscope image and the spectral image, and storage is made in the central control device 16 as data in which both are combined.

Figure 8:
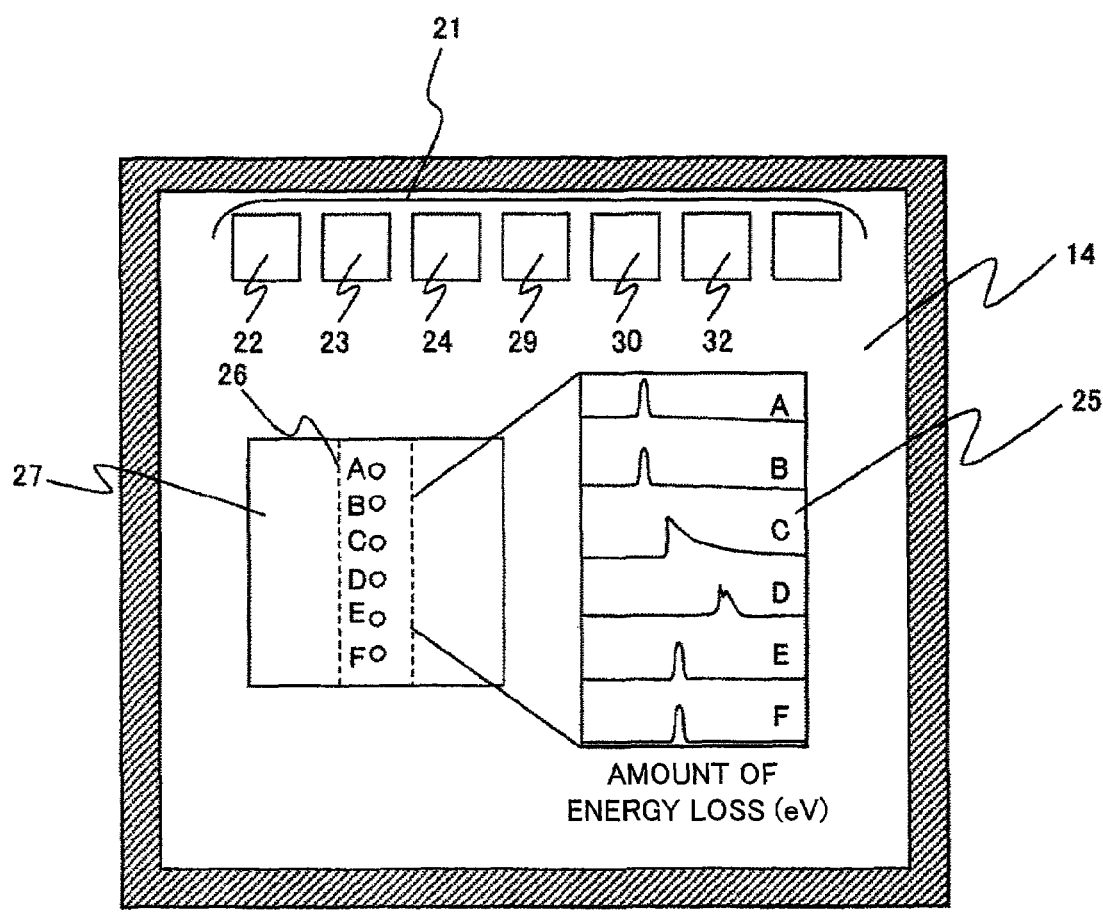
FIG. 8 is a diagram showing one example in an image display device in a transmission electron microscope with an electronic spectroscope.

FIG. 8 shows one example of display contents in the image display device 14, and shows an example that a magnification and a measurement position of the spectral image are corrected by the system for correcting magnification and position, and a transmission electron microscope image and an electron energy loss spectrum acquired at a selected place are displayed. Feature point of the display contents shown in FIG. 8 is that the transmission electron microscope image and the electron energy loss spectral image are displayed, and a measurement position and range of the electron energy loss spectral image are recognizable in the transmission electron microscope image.

Start switches of correction function of respective magnifications and positions may be provided in the control device or the like of the electron microscope; however, it is preferable to be able to make selections on the display device while checking measurement results. In the example shown in FIG. 8, a selection button group 21 is displayed on the image display device. The selection button group 21 includes a switching button of the spectral image and the transmission electron microscope image, an acceptance start button of the spectral image, a change button of acceptance time of the spectral image, a button for setting an amount of energy loss 22 of the spectral image, a button for correcting spectral image magnification 23, a button for correcting spectral image position 24, and the like.

When the button for correcting spectral image magnification 23 in the selection button group 21 is selected, the transmission electron microscope image and the spectral image are continuously acquired by the image detector 13, and an image resolution (distance per one pixel) is calculated from each image.

Furthermore, when the button for correcting spectral image position 24 is selected after the spectral image and the transmission electron microscope image are acquired at a desired position, storage is made as data in which the spectral image and the transmission electron microscope image corresponding to the measurement position of the spectral image are combined. That is, the measurement position of the spectral image and the electron energy loss spectrum at each measurement position are stored in the transmission electron microscope image. In addition, a region limited by the visual field limit slit 17 is also stored as a spectrum measurement region 26.

The number of the electron energy loss spectra to be displayed can be arbitrarily set, and the electron energy loss spectra at places selected on the transmission electron microscope image 27 are displayed on a spectrum display portion 25 one after another. Furthermore, when a selection region is enlarged, the electron energy loss spectrum added in the selection region is displayed. As for the electron energy loss spectrum displayed on the spectrum display portion 25, measurement data may be directly displayed or a signal processing such as background elimination can also be made. The electron energy loss spectral image may be displayed for each aperture of slits as shown in FIG. 8, or for each region into which one aperture is divided as shown in FIG. 9.

Figure 9:
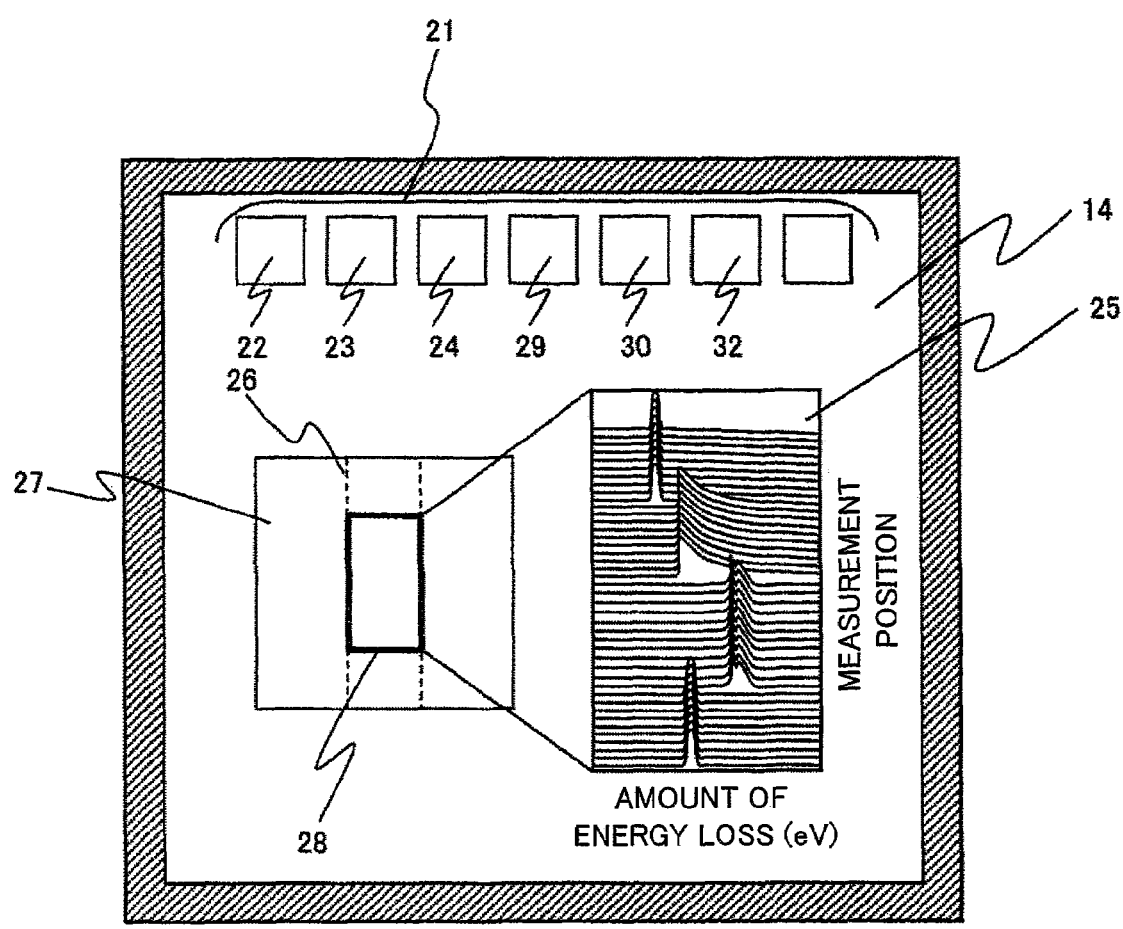
FIG. 9 is a diagram showing one example in an image display device in a transmission electron microscope with an electronic spectroscope.

FIG. 9 shows one example of display contents in the image display device 14 and an example in which an electron energy loss spectrum acquired in a region selected on a transmission electron microscope image 27 is divided and displayed.

After a place for which a spectrum is desired to be displayed on the transmission electron microscope image 27 is selected by a region selection tool 28, a line analysis button 29 in the selection button group 21 is selected, and a divided region width in a y axis direction (vertical direction) in a selection region is inputted. After that, the electron energy loss spectrum divided by the divided region width is continuously displayed on the spectrum display portion 25.

Figure 10:
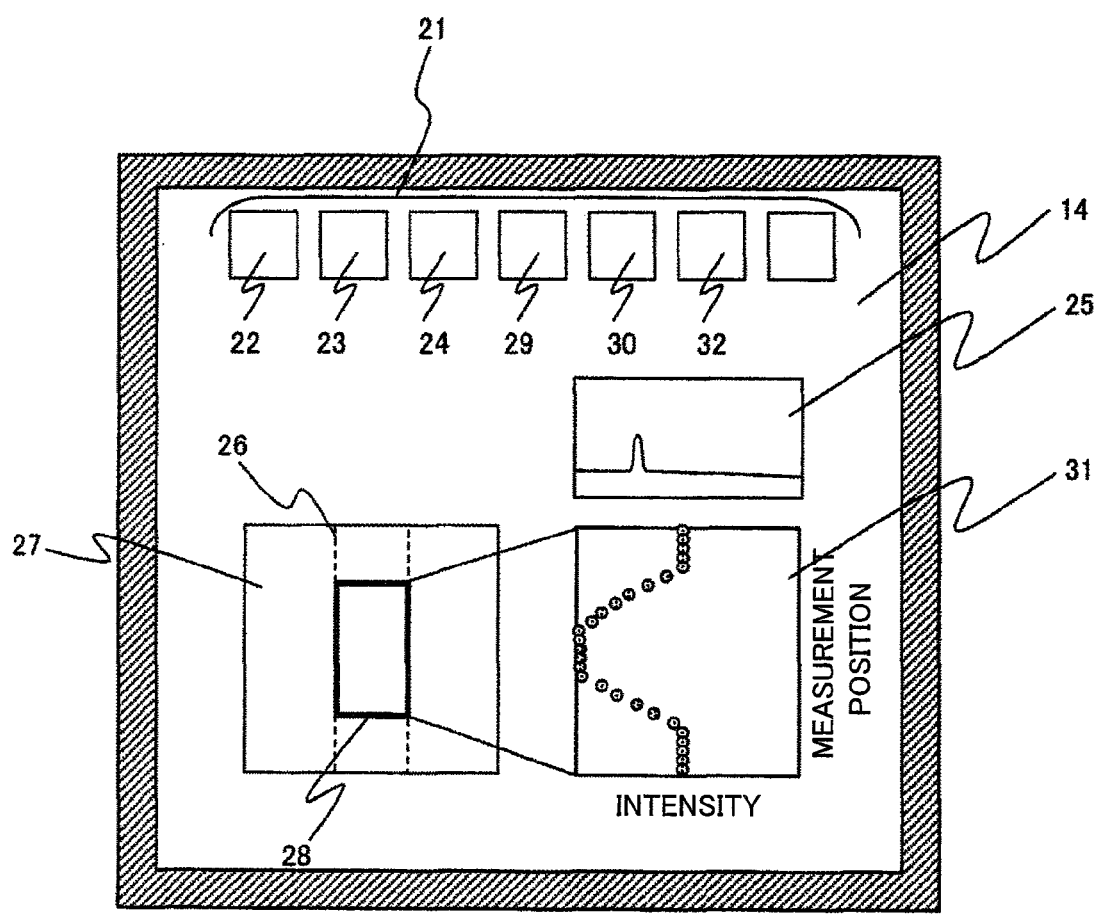
FIG. 10 is a diagram showing one example in an image display device in a transmission electron microscope with an electronic spectroscope.

FIG. 10 shows one example of display contents in the image display device 14, and an example in which a transmission electron microscope image 27 and an intensity profile of a spectrum acquired in a selected region is displayed.

When an intensity profile display button 30 is selected after a place for which an intensity profile of a continuous spectrum is desired to be displayed on the transmission electron microscope image 27 is selected by a region selection tool 28, an intensity profile of the spectrum at each measurement position is displayed on an intensity profile display portion 31. In the case where a spectral image of a different element at the same region is acquired, an intensity profile of each element can be displayed on the intensity profile display portion 31 in overlapped different colors. An energy loss value may be directly input in the intensity profile region; and, in the case where a spectrum for any place is displayed on the spectrum display portion 25, a part for which the intensity profile is required to be calculated may be selected in the spectrum display portion 25.

Figure 11:
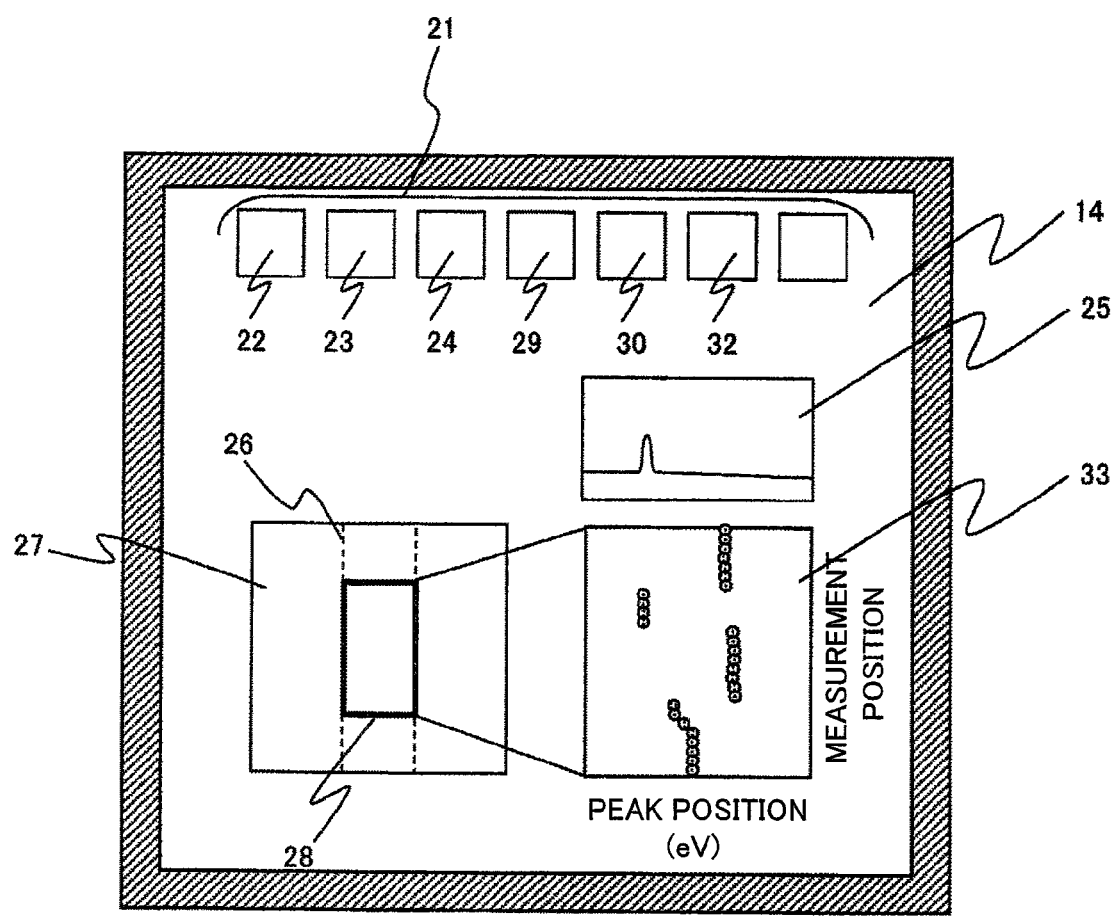
FIG. 11 is a diagram showing one example in an image display device in a transmission electron microscope with an electronic spectroscope.

FIG. 11 shows one example of display contents in the image display device 14, and an example in which a transmission electron microscope image 27 and a peak position of a spectrum acquired in a selected region is displayed.

When a peak position display button 32 is selected after a place for which a peak position of a continuous spectrum is desired to be displayed on the transmission electron microscope image 27 is selected by a region selection tool 28, a peak maximum intensity position of the spectrum at each measurement position is displayed on a peak position display portion 33. In the case where the peak maximum intensity position is displayed, in the spectrum displayed on the spectrum display portion, an energy loss value in which a peak intensity in the selection region of each spectrum becomes the maximum may be displayed after an energy region is selected, or there may be displayed an energy loss value in which a first derivative of a peak intensity becomes the maximum.

The buttons of the above described respective functions can be appropriately moved and arranged in the image display device 14. Furthermore, the respective function buttons may be toolbars. In addition, arrangement may be freely made even for the transmission electron microscope image 27, the spectrum display portion 25, the intensity profile display portion 31, and the like shown in the image display device 14.

What is claimed is:

1. A method for correcting magnification of a spectral image formed in two orthogonal axes which are an energy dispersion axis and a position information axis of an electronic spectroscope, the spectral image being acquired with a transmission electron microscope provided with the electronic spectroscope, the method for correcting magnification of the spectral image comprising the step of:
   correcting the magnification of said spectral image by both an image pattern of the electronic spectroscope of a transmission electron microscope image acquired with said transmission electron microscope and an image pattern of the electronic spectroscope of said spectral image.

2. A method for correcting measurement position of a spectral image formed in two orthogonal axes which are an energy dispersion axis and a position information axis of an electronic spectroscope, the spectral image being acquired with a transmission electron microscope provided with the electronic spectroscope, the method for correcting measurement position of said spectral image comprising the step of:
   correcting the measurement position of the spectral image by both an image pattern of the electronic spectroscope of a transmission electron microscope image acquired with said transmission electron microscope and an image pattern of the electronic spectroscope of said spectral image.

3. A transmission electron microscope comprising: an electron gun which irradiates a sample with an electron beam; a convergent lens group which converges the electron beam irradiated from said electron gun; a focusing lens group which focuses the electron beam transmitted through the sample; an image detector which detects a focused image; a visual field limit slit which selects an observation range of said sample; and an electronic spectroscope which spectrally decomposes the electron beam by an amount of energy which the electron beam transmitted through said sample has,
   wherein the electronic spectroscope is an electronic spectroscope which outputs a spectral image whose convergent position is different in an energy dispersion direction and a direction perpendicular to the energy dispersion direction; and has a correction device which corrects a magnification and a measurement position of said spectral image.

4. The transmission electron microscope according to claim 3,
   wherein said visual field limit slit has apertures disposed in a direction parallel to the energy dispersion direction.

5. The transmission electron microscope according to claim 3,
   wherein said transmission electron microscope has a correction start switch which corrects the magnification and the measurement position of said spectral image by said correction device.

6. The transmission electron microscope according to claim 3,
   further comprising: a spectrum display function which divides said acquired spectral image into each predetermined region, and displays an electron energy loss spectrum for each region.

7. The transmission electron microscope according to claim 3,
   further comprising: an intensity profile display function which divides said acquired spectral image into each predetermined region, and displays a spectrum intensity profile from an electron energy loss spectrum for each region.

8. The transmission electron microscope according to claim 3,
   further comprising: a peak position display function which divides said acquired spectral image into each predetermined region, and displays a peak maximum intensity position of the spectrum from an electron energy loss spectrum for each region.

9. A method for correcting magnification of a spectral image of a transmission electron microscope which is provided with an electronic spectroscope and is capable of acquiring a transmission electron microscope image and a spectral image, the method for correcting magnification of the spectral image comprising the steps of:
   calculating an image resolution from a transmission electron microscope image of a reference sample;
   storing said image resolution in a storage device;
   inserting a slit having a plurality of apertures on an electron beam orbit of said transmission electron microscope;
   calculating the number of pixels according to a pattern of the slit from the transmission electron microscope image taken of the reference sample via said slit;
   calculating the size of said slit pattern on the reference sample from the number of pixels in said slit pattern;
   acquiring a spectral image using said electronic spectroscope;
   calculating an image resolution of the spectral image from a distance between image patterns of said spectral image; and
   correcting the magnification of the spectral image.

10. A method for correcting measurement position of a spectral image of a transmission electron microscope which is provided with an electronic spectroscope and is capable of acquiring a transmission electron microscope image and a spectral image, the method for correcting measurement position of the spectral image comprising the steps of:
    taking a first electron microscope image of a sample with a transmission electron microscope via a correction slit;
    acquiring a spectral image of the sample without changing a position on the sample;
    taking a second electron microscope image of the sample with the transmission electron microscope again without changing the position on the sample;
    comparing said first and the second electron microscope images; and outputting a measurement result by judging that the spectral image has been measured at a correct measurement position when said first and the second electron microscope images are matched.

11. A transmission electron microscope which is provided with an electronic spectroscope and is capable of acquiring a transmission electron microscope image and a spectral image, the transmission electron microscope comprising:

a correction device which corrects a measurement position of a spectral image; and an image display device which displays an electron microscope image and the spectral image, wherein said correction device acquires a first electron microscope image taken of a sample by the transmission electron microscope via a correction slit, a spectral image of the sample acquired without changing a position on the sample, and a second electron microscope image taken by the transmission electron microscope after acquiring the spectral image; and compares said first and the second electron microscope images, and said image display device combines said electron microscope image and said spectral image in response to a pattern of a slit for correcting magnification and position when said first and the second electron microscope images are matched; and outputs image information which displays said electron microscope image and said spectral image as one image.

12. The transmission electron microscope according to claim 11, wherein said image information is such that the measurement position and range of said spectral image are recognizable in the transmission electron microscope image.

* * * * *